(12) United States Patent
Tanabe et al.

(10) Patent No.: US 11,914,283 B2
(45) Date of Patent: Feb. 27, 2024

(54) REFLECTIVE MASK BLANK AND REFLECTIVE MASK

(71) Applicant: AGC INC., Tokyo (JP)

(72) Inventors: Hiroyoshi Tanabe, Tokyo (JP); Hiroshi Hanekawa, Tokyo (JP); Toshiyuki Uno, Tokyo (JP)

(73) Assignee: AGC INC., Tokyo (JP)

( * ) Notice: Subject to any disclaimer, the term of this patent is extended or adjusted under 35 U.S.C. 154(b) by 131 days.

(21) Appl. No.: 17/658,763

(22) Filed: Apr. 11, 2022

(65) Prior Publication Data

US 2022/0236636 A1     Jul. 28, 2022

Related U.S. Application Data

(63) Continuation of application No. PCT/JP2020/040115, filed on Oct. 26, 2020.

(30) Foreign Application Priority Data

Oct. 29, 2019     (JP) .................................. 2019-195856

(51) Int. Cl.
    *G03F 1/24*           (2012.01)
    *G03F 1/52*           (2012.01)
    *G03F 1/54*           (2012.01)

(52) U.S. Cl.
    CPC .................. *G03F 1/24* (2013.01); *G03F 1/52* (2013.01); *G03F 1/54* (2013.01)

(58) Field of Classification Search
    CPC ................ G03F 1/24; G03F 1/52; G03F 1/54
    USPC .......................................................... 430/5
    See application file for complete search history.

(56) References Cited

U.S. PATENT DOCUMENTS

| | | |
|---|---|---|
| 5,641,593 A | 6/1997 | Watanabe et al. |
| 2005/0208389 A1 | 9/2005 | Ishibashi et al. |
| 2008/0248409 A1 | 10/2008 | Ishibashi et al. |
| 2018/0356719 A1 | 12/2018 | Ikebe et al. |
| 2019/0361338 A1 | 11/2019 | Ikebe et al. |
| 2019/0384158 A1 | 12/2019 | Ikebe et al. |
| 2020/0064725 A1 | 2/2020 | Nozawa et al. |

FOREIGN PATENT DOCUMENTS

| | | |
|---|---|---|
| JP | 7-114173 A | 5/1995 |
| JP | 4163038 B2 | 10/2008 |
| JP | 2010-67757 A | 3/2010 |
| JP | 5266988 B2 | 8/2013 |
| JP | 2018-141969 A | 9/2018 |
| WO | WO 2017/090485 A1 | 6/2017 |
| WO | WO2018135467 A1 | 7/2018 |
| WO | WO2018159392 A1 | 9/2018 |

OTHER PUBLICATIONS

International Search Report dated Dec. 15, 2020 in PCT/JP2020/040115, filed on Oct. 26, 2020, 3 pages.
Written Opinion of the International Search Authority dated Dec. 15, 2020, in PCT/JP2020/040115 (with English translation).

*Primary Examiner* — Christopher G Young
(74) *Attorney, Agent, or Firm* — Oblon, McClelland, Maier & Neustadt, L.L.P.

(57) ABSTRACT

A reflective mask blank includes a substrate and, on or above the substrate in order, a reflective layer for reflecting EUV light, a protective layer for protecting the reflective layer, and an absorbent layer for absorbing EUV light. The absorbent layer has a reflectance for a wavelength of 13.53 nm of from 2.5% to 10%. A film thickness d of the absorbent layer satisfies a relationship of:

$$d_{MAX} - (i \times 6 + 1)\,\text{nm} \leq d \leq d_{MAX} - (i \times 6 - 1)\,\text{nm}$$

where the integer i is 0 or 1, and $d_{MAX}$ is represented by:

$$d_{MAX}(\text{nm}) = \frac{13.53}{2n\cos 6°}\left\{INT\left(\frac{0.58}{1-n}\right) + \frac{1}{2\pi}\left(\tan^{-1}\left(\frac{-k}{1-n}\right) + 0.64\right)\right\}$$

where n is a refractive index of the absorbent layer, k is an absorption coefficient of the absorbent layer, and INT(x) is a function of returning an integer value obtained by truncating a decimal part.

9 Claims, 10 Drawing Sheets

REFLECTIVE MASK BLANK AND REFLECTIVE MASK

TECHNICAL FIELD

The present invention relates to a reflective mask utilizing a phase shift effect and a reflective mask blank from which the reflective mask is obtained.

BACKGROUND ART

In recent years, with the progress of miniaturization of an integrated circuit constituting a semiconductor device, extreme ultraviolet (Extreme Ultra Violet: hereinafter referred to as "EUV") lithography is being studied as an exposure method replacing the conventional exposure technique using visible light or ultraviolet light (wavelength: from 365 to 193 nm).

In the EUV lithography, EUV light with a shorter wavelength than ArF excimer laser light is used as a light source for exposure. Here, the EUV light means light with a wavelength in the soft X-ray region or vacuum ultraviolet region and, specifically, is light with a wavelength of approximately from 0.2 to 100 nm. As the EUV light used for EUV lithography, for example, EUV light with a wavelength $\lambda$ of about 13.5 nm is used.

EUV light is likely to be absorbed by many substances, and thus, a dioptric system that has been used in conventional exposure techniques cannot be used. Therefore, a catoptric system using a reflective mask, mirrors, etc. is used in EUV lithography. In the EUV lithography, a reflective mask is used as a mask for pattern transfer.

In the reflective mask, a reflective layer for reflecting EUV light is formed on a substrate, and an absorbent layer for absorbing EUV light is patternwise formed on the reflective layer. For obtaining the reflective mask, a reflective mask blank fabricated by stacking a reflective layer and an absorbent layer on a substrate in this order from the substrate side is used as an unpatterned plate, and the absorbent layer is partly removed to form a predetermined pattern.

The EUV light having entered the reflective mask is absorbed by the absorbent layer and reflected by the reflective layer. The reflected EUV light forms an image on a surface of an exposure material (a wafer coated with a resist) by an optical system. This allows the transfer of openings in the absorbent layer to the surface of the exposure material. In EUV lithography, EUV light usually enters the reflective mask from a direction inclined at about 6° and is similarly reflected obliquely.

Conventionally, TaN or TaBN described in Patent Literature 1 is used as the material of the absorbent layer. Such a material is usually used under the conditions of an EUV light reflectance of 2% or less and a film thickness of 60 nm or more. These are optically comparable to the conditions for a binary mask and less effective for a phase shift mask.

A reflective mask utilizing a phase shift effect can be obtained by adjusting the transmittance of the absorbent layer. The absorbent layer slightly transmits light, and the reflected light from the absorbent layer has a phase difference with respect to light reflected in the opening. By using such a reflective mask utilizing a phase shift effect, the contrast of an optical image on a wafer is enhanced, and the exposure margin is increased.

As an example of the reflective mask utilizing a phase shift effect, in Patent Literature 2, TaNb is used as the material of the absorbent layer. In Patent Literature 2, the optimum value of reflectance of the absorbent layer is set to be from 4 to 15% as a relative value to the reflectance of the opening. This value is close to an optimum value of transmittance of the conventional ArF phase shift mask. Since the reflectance of the opening is usually about 65%, the optimum value of reflectance of the absorbent layer becomes from 2.5 to 10% in terms of absolute value.

In Patent Literature 2, the optimum value of phase difference of the reflective mask utilizing phase shift is set to be from 175 to 185°. This range includes 180° that is an optimum value of phase difference of the conventional ArF phase shift mask.

In the case of an ArF phase shift mask, a thin-film approximation of ignoring a film thickness of the absorbent layer is established and therefore, the optimum value of phase difference becomes 180°. However, in the case of a reflective mask used in EUV lithography, a thin-film approximation cannot be used, because the film thickness of the absorbent layer lies on the same level as the pattern size. FIG. 3A is a diagram illustrating an example of the reflected light intensity distribution in a reflective mask utilizing a phase shift effect, and FIG. 3B is a diagram illustrating an example of the reflected light phase distribution in the reflective mask. The abscissa axes of FIG. 3A and FIG. 3B display a position in a width direction of a pattern with a width of 64 nm, provided that the center position of the pattern is 0 nm. As illustrated in FIG. 3A, the reflected light intensity reaches a maximum at the center of the pattern and continuously decreases toward edge regions (pattern edges) in the width direction of the pattern. As illustrated in FIG. 3B, the phase of reflected light reaches a minimum at the center of the pattern, and the reflected light phase continuously changes toward pattern edges. Due to influence therefrom, the effective phase difference deviates. Consequently, in the case of a reflective mask, the optimum value of phase difference of the absorbent layer is not 180°.

On the other hand, for the reason that the exposure time is shortened and this is advantageous in terms of throughput, the optical image intensity during exposure is preferably high. In turn, the peak light intensity during exposure is preferably high.

CITATION LIST

Patent Literature

Patent Literature 1: Japanese Patent No. 4163038
Patent Literature 2: Japanese Patent No. 5266988

SUMMARY OF INVENTION

Technical Problem

An object of the present invention is to provide a reflective mask for EUV lithography, ensuring that the phase shift effect is large and the peak light intensity during exposure is high, and a reflective mask blank for EUV lithography, from which the reflective mask is obtained.

Solution To Problem

As a result of many intensive studies to attain the object above, the present inventors have discovered film thickness conditions of the absorbent layer under which, in a reflective mask for EUV lithography, the phase shift effect is large and the peak light intensity during exposure is high.

FIG. 4A shows the results of a simulation for determining the absorbent layer film thickness dependency of NILS (Normalized Image Log Slope) performed using a TaNb (refractive index n=0.945, absorption coefficient k=0.0236) single-layer film as the absorbent layer and exposing a 22-nm hole pattern on a wafer under the exposure conditions of a wavelength of 13.53 nm, a numerical aperture NA of projection optical system of 0.33 and a σ value of 0.5. NILS corresponds to the contrast of an optical image on the wafer. In FIG. 4A, when the absorbent layer film thickness is 72 nm, NILS is maximized and here, the phase shift effect is also maximized.

FIG. 4B shows the results of a simulation for determining the absorbent layer film thickness dependency of phase difference under the same conditions. In FIG. 4B, when the film thickness is 72 nm, the phase difference is about 210°. This is caused because, as described above, reflected light phase continuously changes toward pattern edges and due to influence therefrom, the optimum value of phase difference is deviated from 180°. Since NILS is maximized at a film thickness of 72 nm, the effective phase difference is estimated to be nearly 180°.

FIG. 4C shows the results of a simulation for determining the film thickness dependency of reflectance of the absorbent layer under the same conditions. The reflectance is maximized when the film thickness is 72 nm. The conditions for maximizing the phase shift effect are that the effective phase difference is about 180° and the reflectance is maximal. Therefore, the maximum value of NILS and the maximal value of reflectance coincide.

As seen in FIG. 4A to FIG. 4C, NILS, phase difference and reflectance oscillate as the film thickness of the absorbent layer increases. This phenomenon is caused because, as illustrated in FIG. 5, interference occurs between reflected light 100 from a reflective layer 20 and reflected light 200 on the absorbent layer 40 surface. When the film thickness of the absorbent layer increases, a position where interferences are mutually intensified and a position where interferences are mutually weakened are generated alternately. The maximal value of reflectance corresponds to a position where interferences are mutually intensified, i.e., a case where phases of reflected light 100 and reflected light 200 are aligned.

The conditions for aligning phases of reflected light 100 and reflected light 200 are determined as follows. First, when only the optical path length difference in the absorbent layer 40 is considered, denoting the film thickness of the absorbent layer 40 as d, the conditions for aligning phases of reflected light 100 and reflected light 200 are represented by the following formula (1):

[Math. 1]

$$d = \frac{\lambda}{2n\cos\theta} N \qquad (1)$$

In formula (1), N is an integer, λ is the wavelength, n is the refractive index of the absorbent layer 40, and θ is the incident angle. In the case of a reflective mask for EUV lithography, the wavelength λ is 13.53 nm, and the incident angle θ is 6°.

Next, with respect to reflected light 100 and reflected light 200, respective phase deviations on reflective surface are considered. Reflected light 100 undergoes reflection inside the reflective layer 20. The phase deviation here is determined to be −0.64 radians through numerical calculation. On the other hand, reflected light 200 undergoes reflection on the absorbent layer 40 surface, and the phase deviation is then $\tan^{-1}(-k/(1-n))$, wherein n is the refractive index of the absorbent layer 40 for a wavelength of 13.53 nm and k is the absorption coefficient of the absorbent layer 40 for the same wavelength. The conditions for aligning phases of reflected light 100 and reflected light 200 are, taking into account the phase deviation on the reflective surface, given by the following formula (2):

[Math. 2]

$$d \text{ (nm)} = \frac{13.53}{2n\cos 6°}\left\{N + \frac{1}{2\pi}\left(\tan^{-1}\left(\frac{-k}{1-n}\right) + 0.64\right)\right\} \qquad (2)$$

Formula (2) is the conditions for aligning phases of reflected light 100 and reflected light 200, i.e., the conditions for allowing the reflectance to have a maximal value. For letting NILS have a maximum value, it is further required that the effective phase difference becomes about 180°. At this time, as illustrated in FIG. 4B, the phase difference of the absorbent layer 40 is about 210°. Denoting the film thickness of the absorbent layer 40 as d, the difference of optical path length when light reciprocates in the absorbent layer 40, from that in vacuum, is 2(1−n)d. The phase difference here corresponds to 210° in the case of 2(1−n)d=210/360·λ. From this, the film thickness $d_{MAX}$ of the absorbent layer when NILS takes a maximum value has approximately the following formula (3):

[Math. 3]

$$d_{MAX} \sim \frac{0.29\lambda}{1-n} \sim \frac{\lambda}{2} INT\left(\frac{0.58}{1-n}\right) \qquad (3)$$

Finally, considering ncos6° is approximately equal to 1, formula (4) is obtained by combining formula (2) and formula (3).

[Math. 4]

$$d_{MAX}\text{(nm)} = \frac{13.53}{2n\cos 6°}\left\{INT\left(\frac{0.58}{1-n}\right) + \frac{1}{2\pi}\left(\tan^{-1}\left(\frac{-k}{1-n}\right) + 0.64\right)\right\} \qquad (4)$$

Here, INT(x) is a function of returning an integer value obtained by truncating the decimal part. Formula (4) is the conditions which the film thickness of the absorbent layer must satisfy so as to maximize the phase shift effect.

In the forgoing pages, only maximization of NILS by the phase shift effect is considered. Another important property that should be considered at the time of exposure is the intensity of an optical image. As the optical image intensity is higher, the exposure time can be shorter, leading to enhancement of the throughput. In the present description, the peak intensity during exposure is used as the index of the optical image intensity at the time of exposure. FIG. 7A shows the results of a simulation for determining the thickness dependency of NILS, FIG. 7B shows the results of a simulation for determining the thickness dependency of peak light intensity, and FIG. 7C shows the results of a simulation for determining the thickness dependency of phase difference. In FIG. 7A to FIG. 7C, the abscissa axes display a difference between the film thickness of the absorbent layer and the absorbent layer film thickness $d_{MAX}$ when NILS determined above takes a maximum value. The exposure conditions are the same as in FIG. 4. The film thickness $d_{MAX}$ of the absorbent layer is determined to be 72.3 nm according to formula (4).

As seen from FIG. 7B, the peak light intensity during exposure increases as the film thickness is thinner. On the other hand, NILS is maximized when the film thickness of the absorbent layer is $d_{MAX}$, and has a peak also at $d_{MAX}-6$ nm. The light intensity at a film thickness $d_{MAX}-6$ nm is higher by 6% than the light intensity at the film thickness $d_{MAX}$. Considering the balance between NILS and light intensity, the optimum value of the film thickness of the absorbent layer is either $d_{MAX}$ or $d_{MAX}-6$ nm.

As illustrated in FIG. 7C, the phase difference at the film thickness $d_{MAX}$. is 210°, and the phase difference at the film thickness $d_{MAX}-6$ nm is 203°. Thus, both are greatly deviated from 180°. Considering the film thickness variation +−1 nm, the optimum value of phase difference is from 190° to 220°. NILS at a film thickness allowing the phase difference to become 180° all deviates from the peak, and it is understood that the absorbent layer film thickness giving a phase difference of 180° is not its optimum value.

In actually depositing the absorbent layer, a variation of about +−1 nm occurs in the film thickness. As seen from FIG. 7A to FIG. 7C, even when such a degree of variation occurs, the amount of reduction in NILS is small and allowable. At this time, the variation of peak wavelength in the reflected light spectrum is about +−0.1 nm. Accordingly, as long as the film thickness d (nm) of the absorbent layer satisfies $d_{MAX}-1$ nm≤d≤$d_{MAX}+1$ nm or ($d_{MAX}-6$ nm)−1 nm≤d≤($d_{MAX}-6$ nm)+1 nm, a great phase shift effect is obtained, and the peak light intensity during exposure increases. These formulae are combined into the following formula (5):

[Math. 5]

$$d_{MAX} - (i \times 6 + 1) \text{ nm} \le d \le d_{MAX} - (i \times 6 - 1) \text{ nm} \qquad (5)$$

Here, the integer i is 0 or 1.

In the reflective mask blank illustrated in FIG. 2, the absorbent layer 40 consists of two layers, i.e., a lower absorbent layer 41 and an upper absorbent layer 42. In this case, as illustrated in FIG. 6, interference occurs between reflected light 100 from the reflective layer 20 and reflected light 202 on the upper absorbent layer 42 surface. Since reflected light 202 undergoes reflection on the upper absorbent layer 42 surface, the phase deviation is $\tan^{-1}(-k_2/(1-n_2))$, wherein $k_2$ is the absorption coefficient of the upper absorbent layer 42 for a wavelength of 13.53 nm and $n_2$ is the refractive index of the upper absorbent layer for the same wavelength.

Denoting as $d_{bi}$ the film thickness of the absorbent layer 40 consisting of two layers, the conditions for aligning phases of reflected light 100 and reflected light 200 are, taking into account the phase deviation on the reflective surface, given by the following formula (6), and the film thickness $d_{bi\ MAX}$ when NILS takes a maximum value is approximately the following formula (7):

[Math. 6]

$$d_{bi}(\text{nm}) = \frac{13.53}{2n_1 \cos 6°}\left\{N + \frac{1}{2\pi}\left(\tan^{-1}\left(\frac{-k_2}{1-n_2}\right) + 0.64\right)\right\} \qquad (6)$$

[Math. 7]

$$d_{biMAX}(\text{nm}) = \frac{13.53}{2n_1 \cos 6°}\left\{INT\left(\frac{0.58}{1-n_1}\right) + \frac{1}{2\pi}\left(\tan^{-1}\left(\frac{-k_2}{1-n_2}\right) + 0.64\right)\right\} \qquad (7)$$

Also in this case, as long as the film thickness $d_{bi}$ (nm) of the absorbent layer 40 consisting of two layers satisfies $d_{bi\ MAX}-1$ nm≤$d_{bi}$≤$d_{bi\ MAX}+1$ nm or ($d_{bi\ MAX}-6$ nm)−1 nm≤$d_{bi}$≤($d_{bi\ MAX}-6$ nm)−nm, a great phase shift effect is obtained, and the peak light intensity during exposure increases.

These formulae are combined into the following formula:

[Math. 8]

$$d_{biMAX} - (i \times 6 + 1) \text{ nm} \le d_{bi} \le d_{biMAX} - (i \times 6 - 1) \text{ nm} \qquad (8)$$

Here, the integer i is 0 or 1.

As understood from formula (4), $d_{MAX}$ significantly depends on the refractive index n of the absorbent layer. As understood from formula (7), $d_{bi\ MAX}$ significantly depends on the refractive index $n_1$ of the lower absorbent layer and the refractive index $n_2$ of the upper absorbent layer. However, in terms of control during manufacture of a mask blank, it is difficult to frequently measure n, $n_1$, and $n_2$.

As a more realistic method for controlling the film thickness of the absorbent layer, there may be a method using a reflected light spectrum. The reflected light spectrum can be measured using a commercially available device. FIG. 8 illustrates reflected light spectra when the film thickness of the absorbent layer is $d_{MAX}$ and $d_{MAX}-6$ nm. The peak wavelength $\lambda_{MAX}$ is 13.53 nm and 13.63 nm, respectively. As the reference for controlling the film thickness of the absorbent layer, a peak wavelength $\lambda_{MAX}$ of reflected light can be used.

In this case, as long as the peak wavelength $\lambda_{MAX}$ satisfies (13.53−0.1) nm≤$\lambda_{MAX}$≤(13.53+0.1) nm or (13.63−0.1) nm≤$\lambda_{MAX}$≤(13.63+0.1) nm, a great phase shift effect is obtained, and the peak light intensity during exposure increases.

Advantageous Effects of Invention

The phase shift effect is enhanced by using the reflective mask of the present invention. In addition, when the reflective mask of the present invention is used, the peak light intensity during exposure rises, the contrast of an optical image on a wafer is enhanced while ensuring the throughput, and the exposure margin increases.

DESCRIPTION OF EMBODIMENTS

The embodiments of the present invention are described in detail below.

<Reflective Mask Blank>

Figure 1:
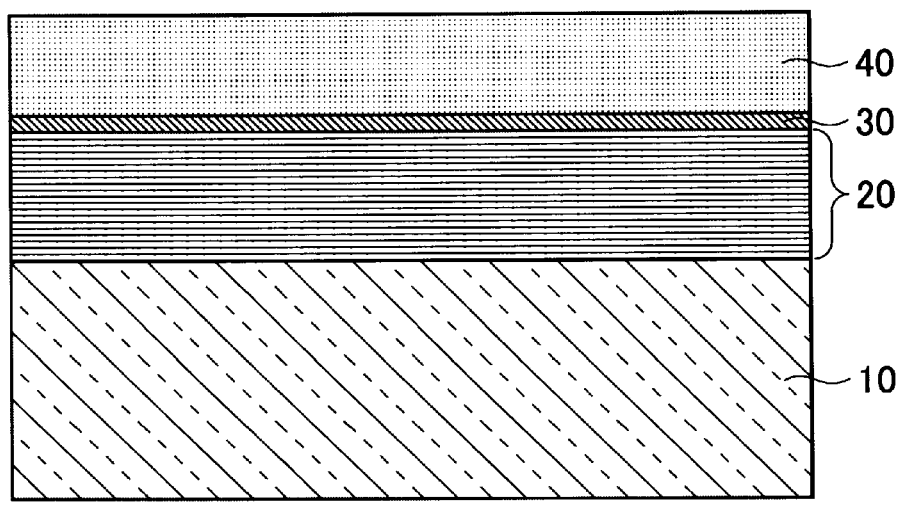
FIG. 1 is a schematic cross-sectional diagram illustrating one configuration example of the reflective mask blank according to an embodiment of the present invention.

The reflective mask blank according to an embodiment of the present invention is described. FIG. 1 is a schematic cross-sectional diagram illustrating one configuration example of the reflective mask blank according to an embodiment of the present invention. As illustrated in FIG. 1, the reflective mask blank is configured by stacking, in order, a reflective layer 20, a protective layer 30, and an absorbent layer 40 on or above a substrate 10.

Figure 2:
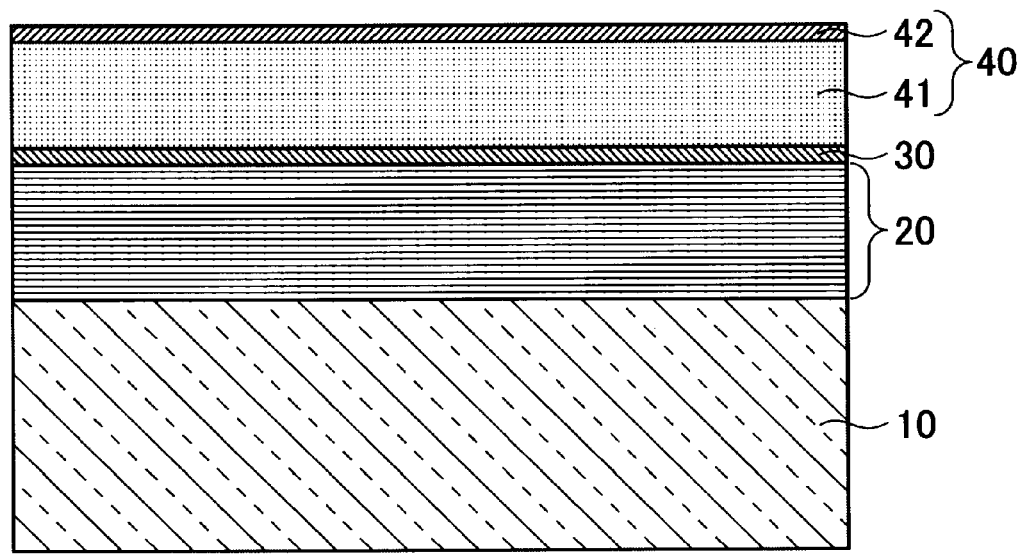
FIG. 2 is a schematic cross-sectional diagram illustrating another configuration example of the reflective mask blank according to an embodiment of the present invention.
Figure 3A:
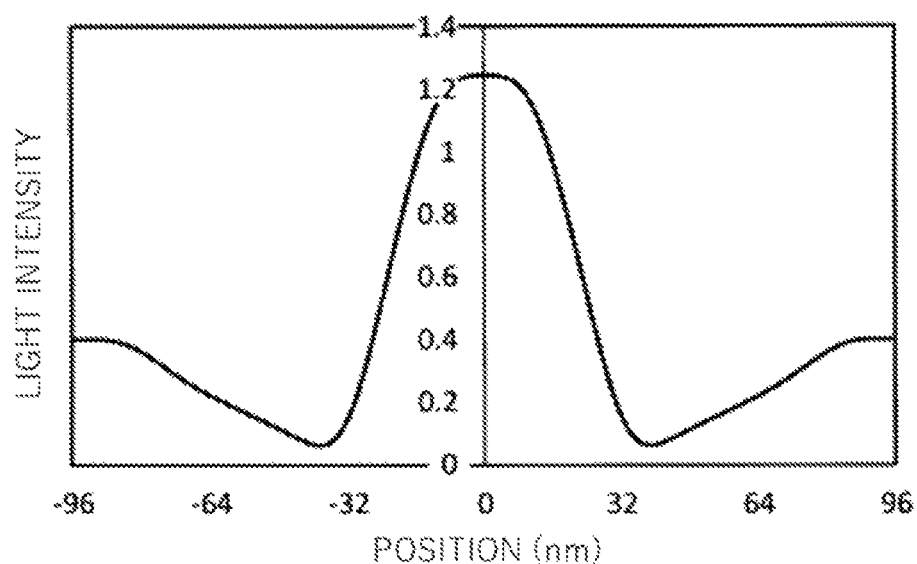
FIG. 3A is a diagram illustrating an example of the reflected light intensity distribution in a reflective mask utilizing a phase shift effect.
Figure 3B:
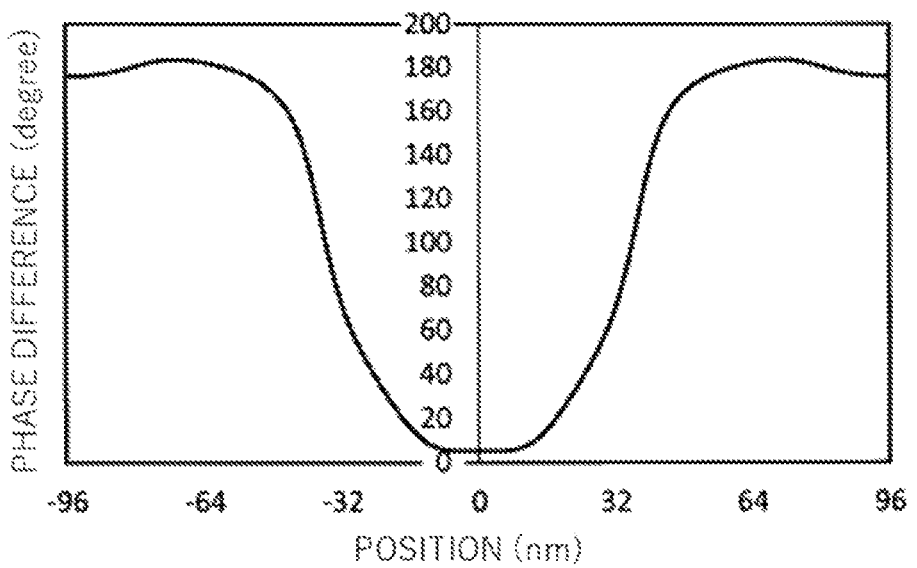
FIG. 3B is a diagram illustrating an example of the reflected light phase distribution in the reflective mask.
Figure 4A:
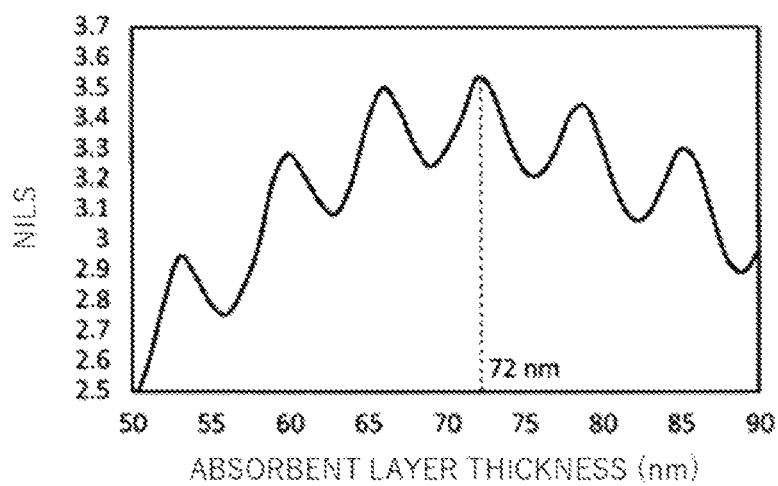
FIG. 4A is a diagram of simulating the absorbent layer film thickness dependency of NILS.
Figure 4B:
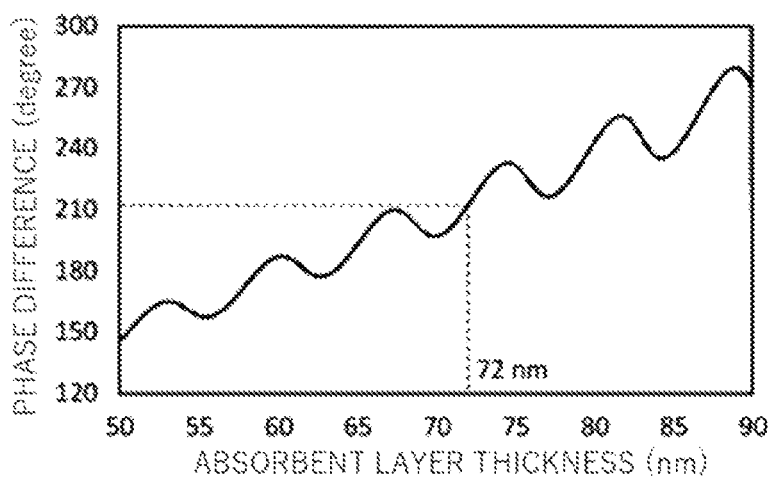
FIG. 4B is a diagram of simulating the absorbent layer film thickness dependency of phase difference.
Figure 4C:
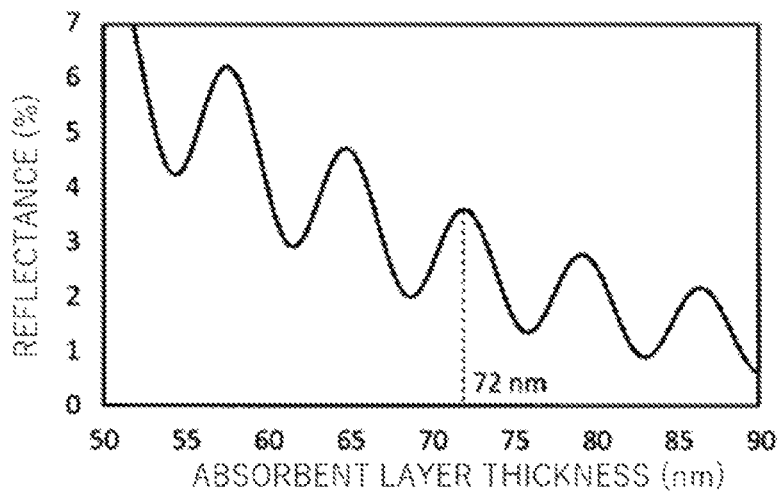
FIG. 4C is a diagram of simulating the absorbent layer film thickness dependency of reflectance.
Figure 5:
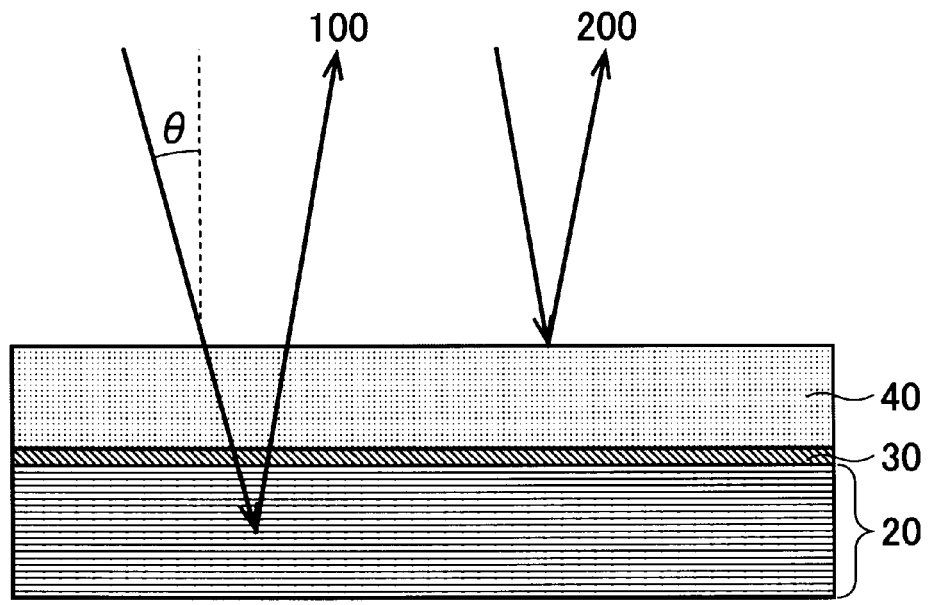
FIG. 5 is a diagram for explaining interference between reflected light from a reflective layer and reflected light from the absorbent layer surface.
Figure 6:
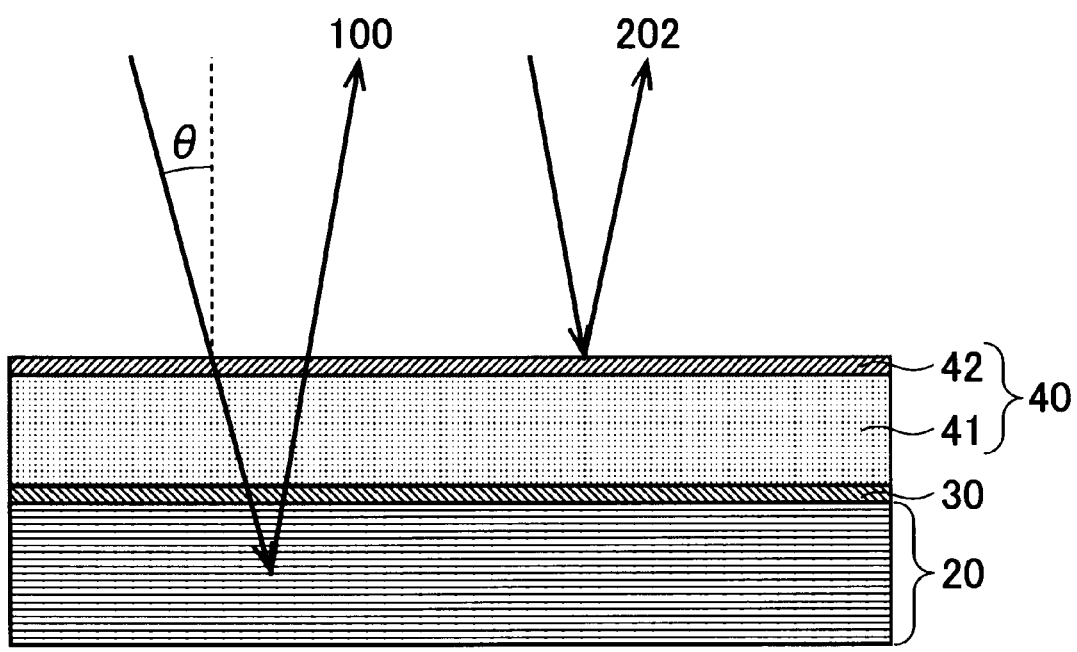
FIG. 6 is a diagram for explaining interference between reflected light from a reflective layer and reflected light from the upper absorbent layer surface.
Figure 7A:
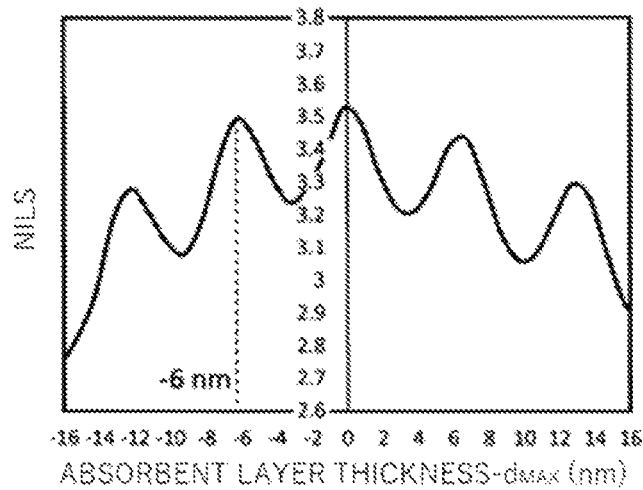
FIG. 7A is a diagram illustrating the relationship between the absorbent layer film thickness-$d_{MAX}$ and NILS.
Figure 7B:
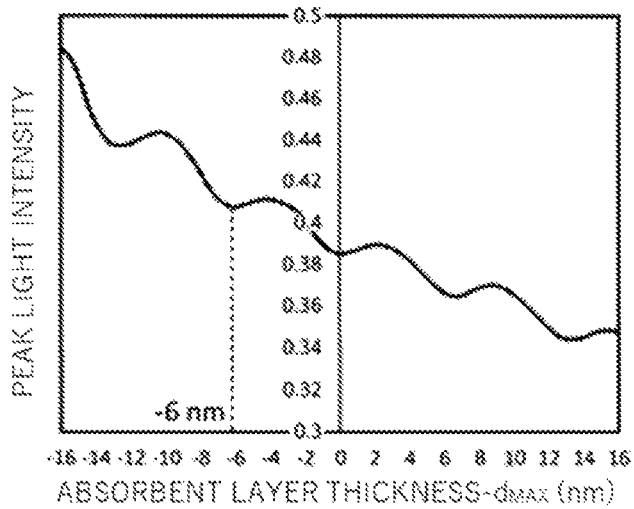
FIG. 7B is a diagram illustrating the relationship between the absorbent layer film thickness-$d_{MAX}$ and the peak light intensity.
Figure 7C:
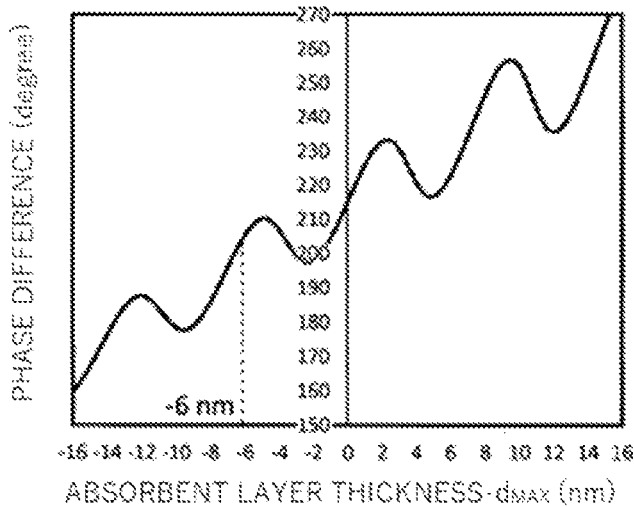
FIG. 7C is a diagram illustrating the relationship between the absorbent layer film thickness-$d_{MAX}$ and the phase difference.
Figure 8:
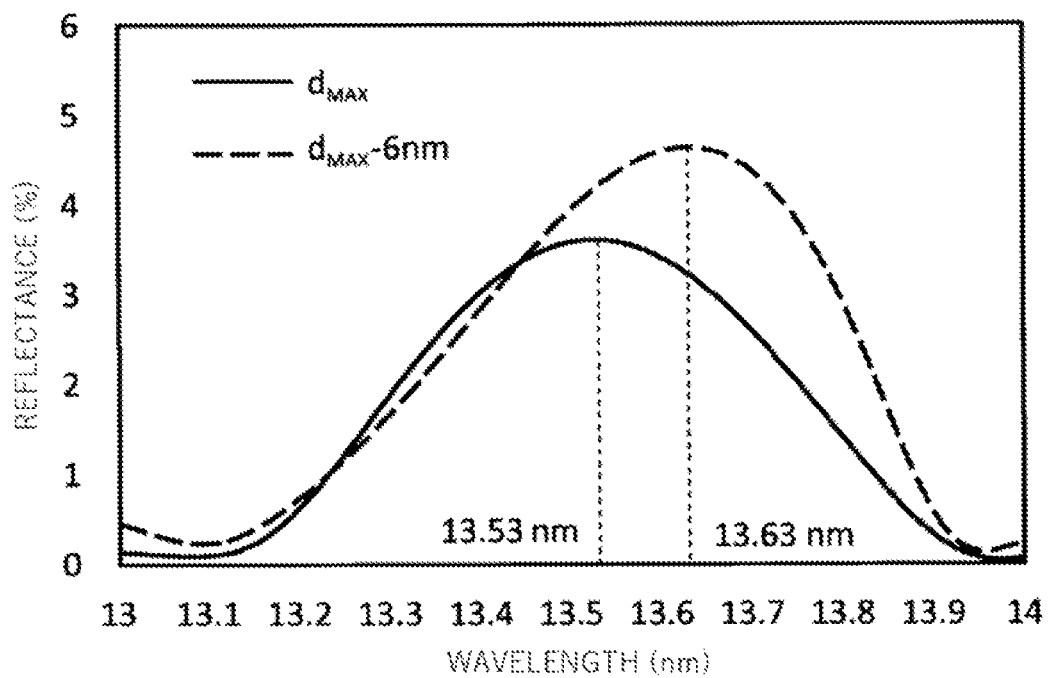
FIG. 8 is a diagram illustrating reflected light spectra when the absorbent layer film thickness is $d_{MAX}$ and $d_{MAX}$–6 nm.

FIG. 2 is a schematic cross-sectional diagram illustrating another configuration example of the reflective mask blank according to an embodiment of the present invention. As illustrated in FIG. 2, the reflective mask blank is configured by stacking, in order, a reflective layer 20, a protective layer 30, a lower absorbent layer 41, and an upper absorbent layer 42 on or above a substrate 10. In the reflective mask blank illustrated in FIG. 2, the absorbent layer 40 consists of two layers, i.e., a lower absorbent layer 41 and an upper absorbent layer 42.

(Substrate)

The coefficient of thermal expansion of the substrate 10 is preferably small. As the coefficient of thermal expansion of the substrate 10 is smaller, a pattern formed in the absorbent layer 40 can be more successfully prevented from occurrence of distortion due to heat during exposure with EUV light. Specifically, the coefficient of thermal expansion of the substrate 10 is, at 20° C., preferably 0±1.0×10⁻⁷/° C., more preferably 0±0.3×10⁻⁷/° C.

As the material having a small coefficient of thermal expansion, for example, a $SiO_2$—$TiO_2$-based glass, etc. can be used. As the $SiO_2$—$TiO_2$-based glass, a silica glass containing from 90 to 95 mass % of $SiO_2$ and from 5 to 10 mass % of $TiO_2$ is preferably used. When the $TiO_2$ content is from 5 to 10 mass %, the coefficient of thermal expansion around room temperature is approximately zero, and substantially no dimensional change occurs around room temperature. The $SiO_2$—$TiO_2$-based glass may contain minor components other than $SiO_2$ and $TiO_2$.

The substrate 10 surface on the side where the reflective layer 20 is stacked (hereinafter, referred to as "main surface") preferably has high smoothness. The smoothness of the main surface can be measured by an atomic force microscope and evaluated by the surface roughness. The surface roughness of the main surface is preferably 0.15 nm or less in terms of root-mean-square roughness Rq.

The main surface is preferably subjected to surface processing so as to have a given flatness. This is purposed to obtain a reflective mask having a high pattern transfer accuracy and a high positional accuracy. In the substrate 10, the flatness in a given region (e.g., a region of 132 mm×132 mm) of the main surface is preferably 100 nm or less, more preferably 50 nm or less, still more preferably 30 nm or less.

In addition, the substrate 10 preferably has resistance to a cleaning liquid used for, e.g., cleaning the reflective mask blank, the reflective mask blank after pattern formation, or the reflective mask.

Furthermore, the substrate 10 preferably has high rigidity so as to prevent a film (e.g., the reflective layer 20) formed on the substrate 10 from deformation due to film stress. For example, the substrate 10 preferably has a high Young' modulus of 65 GPa or more.

(Reflective Layer)

The reflective layer 20 has a high reflectance for EUV light. Specifically, when EUV light enters the reflective layer surface at an incidence angle of 6°, the maximum value of reflectance for EUV light with a wavelength around 13.5 nm is preferably 60% or more, more preferably 65% or more. Also, even when a protective layer is stacked on the reflective layer, the maximum value of reflectance for EUV light with a wavelength around 13.5 nm is likewise preferably 60% or more, more preferably 65% or more.

The reflective layer 20 is preferably a multilayer reflective film in which respective layers containing, as the main component, elements exhibiting different refractive indices to EUV light are stacked periodically in a plurality of cycles. A case where the reflective layer is a multilayer reflective film is described below.

In the multilayer reflective film, layers may be stacked in a plurality of cycles taking as one cycle a laminate structure formed by stacking a high-refractive-index layer and a low-refractive-index layer in this order from the substrate 10 side, or layers may be stacked in a plurality of cycles taking as one cycle a laminate structure formed by stacking a low-refractive-index layer and a high refractive-index layer in this order.

As the high-refractive-index layer, a layer containing Si can be used. By using a high-refractive-index layer containing Si, a reflective mask having an excellent EUV light reflectance can be obtained. As the low-refractive-index layer, a metal selected from the group consisting of Mo, Ru, Rh and Pt or an alloy of these may be used. In this embodiment, it is preferred that the low-refractive-index layer is a Mo-containing layer and the high-refractive-index layer is a Si-containing layer.

Although the multilayer reflective film includes a plurality of high-refractive-index layers and a plurality of low-refractive-index layers, the film thickness need not necessarily be the same among high-refractive-index layers or among low-refractive-index layers.

The thickness and cycle of each layer constituting the multilayer reflective film can be appropriately selected according to the film material used, the EUV light reflectance required of the reflective layer, the wavelength of EUV light (exposure wavelength), etc. For example, in the case where in the reflective layer, the maximum value of reflectance for EUV light with a wavelength around 13.5 nm is 60% or more, a Mo/Si multilayer reflective film formed by alternately stacking a low-refractive-index layer (Mo-containing layer) and a high-refractive-index layer (Si-containing layer) in 30 to 60 cycles is preferably used.

Each of layers constituting the multilayer reflective film can be deposited to have a desired thickness using a known deposition method such as magnetron sputtering method or ion beam sputtering method. For example, in the case of producing the multilayer reflective film by an ion beam sputtering method, this is performed by supplying ion particles from an ion source to a target of a high-refractive-index material and a target of a low-refractive-index material.

(Protective Layer)

Figure 9:
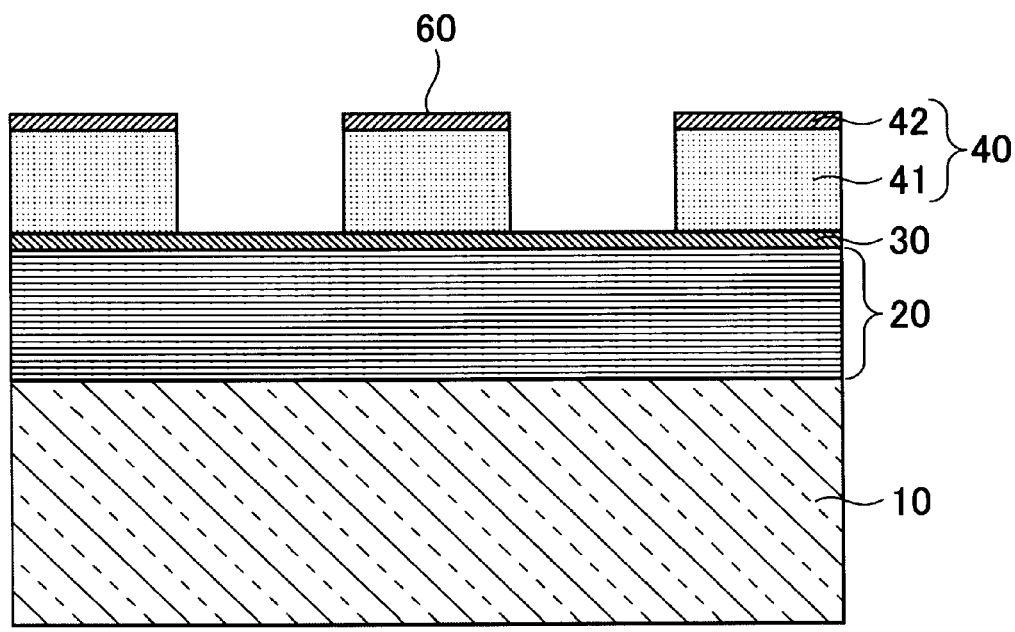
FIG. 9 is a schematic cross-sectional diagram illustrating one configuration example of the reflective mask.

The protective layer 30 protects the reflective layer 20 surface from damage due to etching when an absorber pattern 60 is formed in the absorbent layer 40 by etching (usually, dry etching) the absorbent layer 40 (lower absorbent layer 41, upper absorbent layer 42) at the time of manufacture of the reflective mask illustrated in FIG. 9. In addition, the protective layer protects the reflective layer 20 from a cleaning liquid when the resist remaining in the reflective mask blank after etching is removed using a cleaning liquid to thereby clean the reflective mask blank. Consequently, the EUV light reflectance of the reflective mask obtained is improved.

In FIG. 1 and FIG. 2, the protective layer 30 is illustrated as a single layer, but the protective layer 30 may be formed of a plurality of layers.

As the material for forming the protective layer 30, a substance resistant to damage due to etching at the time of etching the absorbent layer 40 is selected. Examples of the substance satisfying this requirement include a Ru-based material such as elemental Ru metal, Ru alloys obtained by incorporating one or more metals selected from the group consisting of B, Si, Ti, Nb, Mo, Zr, Y, La, Co and Re into Ru, and nitrides obtained by incorporating nitrogen into the Ru alloy above; Cr, Al, Ta, and nitrides obtained by incorporating nitrogen into such a metal; $SiO_2$, $Si_3N_4$, $Al_2O_3$, and a mixture thereof; etc. Among these, elemental Ru metal, Ru alloys, CrN, and $SiO_2$ are preferred. The elemental Ru metal and Ru alloy are more preferred because they are hardly etched with an oxygen-free gas and function as an etching stopper in the processing of the reflective mask.

The film thickness of the protective layer 30 is not particularly limited as long as the function as the protective layer 30 can be fulfilled. From the viewpoint of maintaining the reflectance of EUV light reflected from the reflective layer 20, the film thickness of the protective layer 30 is preferably from 1 nm to 8 nm, more preferably from 1.5 nm to 6 nm, still more preferably from 2 nm to 5 nm.

As the method for forming the protective layer 30, a known film-forming method such as sputtering method or ion beam sputtering method can be used.

(Absorbent Layer)

In order to be used in a reflective mask for EUV lithography, the absorbent layer 40 preferably has properties such as high EUV light absorption coefficient, easy capability of etching, and high cleaning resistance to cleaning liquid.

The absorbent layer 40 absorbs EUV light and has an extremely low EUV light reflectance. However, if the EUV light reflectance is too low, the phase shift effect decreases. Therefore, when the surface of the absorbent layer 40 is irradiated with EUV light, the reflectance for EUV light with a wavelength around 13.53 nm is from 2.5% to 10%. Measurement of the reflectance can be performed using an EUV reflectometer (MBR, manufactured by AIXUV GmbH) for mask blanks.

Furthermore, the absorbent layer 40 is processed by etching, e.g., dry etching with a Cl-based gas or a CF-based gas. Therefore, it is preferred that the absorbent layer 40 can be easily etched.

In addition, the absorbent layer 40 is exposed to a cleaning liquid when the resist pattern remaining on the reflective mask blank after etching is removed with a cleaning liquid at the time of manufacture of the later-described reflective mask. In this regard, as the cleaning liquid, sulfuric acid/hydrogen peroxide mixture (SPM), sulfuric acid, ammonia, ammonia/hydrogen peroxide mixture (APM), OH-radical cleaning water, ozone water, etc. is used.

For the material of the absorbent layer 40, a Ta-based material is preferably used. When N, O, or B is added to Ta, the resistance to oxidation is enhanced, and the stability over time can be improved. In order to facilitate a pattern defect inspection after mask processing, it is also preferred that, as illustrated in FIG. 2, the absorbent layer 40 is configured to have a two-layer structure, e.g., a structure in which a TaON film serving as the upper absorbent layer 42 is stacked on a TaN film serving as the lower absorbent layer 41.

The absorbent layer 40 in the present invention preferably contains one or more elements selected from the group consisting of Ta, Nb, Mo, Ti, Zr, Re, Ru, Au, Pt, Pd, Rh, B, N and O.

If Ta is used as the absorbent layer, the reflectance decreases to 2% or less and thus, the effect is small, though a phase shift effect occurs. When a material having a small absorption coefficient, such as Nb, Mo, Ti or Zr, is used, the phase shift effect can be increased by raising the reflectance. Also, when Ta, N, O, or B is added to the material, the cleaning resistance or the stability over time can be enhanced.

In addition, use of a material having a small refractive index, such as Re, Ru, Au, Pt, Pd, or Rh, enables thinning when used as a phase shift mask. Furthermore, when Ta, N, O, or B is added to the material, the cleaning resistance or the stability over time can be enhanced.

In the absorbent layer 40, the crystal state is preferably amorphous. Due to this, the absorbent layer 40 can have excellent smoothness and flatness. Also, when the smoothness and flatness of the absorbent layer 40 are enhanced, at the time of manufacture of the reflective mask illustrated in FIG. 9, the edge roughness of the absorber pattern 60 is reduced, and the dimensional accuracy of the absorber pattern 60 can be increased.

In the case where, like the reflective mask blank illustrated in FIG. 1, the absorbent layer 40 is a single layer, the number of steps at the time of manufacture of the mask blank can be reduced, and the production efficiency can be enhanced.

In the case where, like the reflective mask blank illustrated in FIG. 2, the absorbent layer 40 consists of two layers, i.e., a lower absorbent layer 41 and an upper absorbent layer 42, the upper absorbent layer 42 can be used, by appropriately setting its optical constant or film thickness, as an antireflection film when inspecting the absorber pattern 60 with use of inspection light at the time of manufacture of the reflective mask illustrated in FIG. 9. This can enhance the inspection sensitivity when inspecting the absorber pattern. Also, when an oxygen-containing material is used for the upper absorbent layer 42, the cleaning resistance or stability is improved.

(Other Layers)

The reflective mask blank of the present invention may include a hard mask layer on the absorbent layer 40. The hard mask layer in the present invention preferably contains at least one element of Cr and Si. As for the hard mask layer, a material having high resistance to etching, specifically, a material having high resistance to dry etching with a Cl-based gas or a CF-based gas, such as a Cr-based film containing Cr or a Si-based film containing Si is used. The Cr-based film includes, for example, Cr and a material obtained by adding O or N to Cr. Specific examples thereof include CrO, CrN, and CrON. The Si-based film includes, for example, Si and a material obtained by adding one or more elements selected from the group consisting of O, N, C and H to Si. Specific examples thereof include $SiO_2$, SiON, SiN, SiO, Si, SiC, SiCO, SiCN, and SiCON. Of these, a Si-based film is preferred, because sidewall regression is less likely to occur when dry-etching the absorbent layer 40. By forming the hard mask layer on the absorbent layer 40, at the time of manufacture of the reflective mask illustrated in FIG. 9, dry etching can be conducted even when the minimum line width of the absorber pattern 60 is reduced. Therefore, this is effective for miniaturization of the absorber pattern 60.

The reflective mask blank of the present invention may include a backside electroconductive layer for electrostatic chucking on the substrate 10 main surface (hereinafter, referred to as backside) opposite to the surface where the reflective layer 20 is stacked. A property required of the backside electroconductive layer is that the sheet resistance value is low. The sheet resistance value of the backside electroconductive layer is, for example, 250 Ω/sq. or less, preferably 200 Ω/sq. or less.

As the material of the backside electroconductive layer, for example, a metal such as Cr or Ta, or an alloy thereof may be used. As for the alloy containing Cr, a Cr compound obtained by incorporating one or more elements selected from the group consisting of B, N, O and C into Cr may be used. As for the alloy containing Ta, a Ta compound obtained by incorporating one or more elements selected from the group consisting of B, N, O and C into Ta may be used.

The film thickness of the backside electroconductive layer is not particularly limited as long as the function as the layer for electrostatic chucking is satisfied, but the film thickness is, for example, from 10 nm to 400 nm. In addition, the backside electroconductive layer can also effect stress adjustment on the backside side of the reflective mask blank. More specifically, the backside electroconductive layer can adjust the stress so as to make the reflective mask blank flat by balancing with the stress from various layers formed on the main surface side.

As the method for forming the backside electroconductive layer, a known deposition method such as magnetron sputtering method or ion beam sputtering method may be used.

The backside electroconductive layer can be formed on the backside of the substrate, for example, before the reflective layer is formed.

<Reflective Mask>

Next, a reflective mask obtained using the reflective mask blank illustrated in FIG. 2 is described. FIG. 9 is a schematic cross-sectional diagram illustrating one configuration example of the reflective mask. In the reflective mask illustrated in FIG. 9, a desired absorber pattern 60 is formed in the absorbent layer 40 (lower absorbent layer 41, upper absorbent layer 42) of the reflective mask blank illustrated in FIG. 2. The absorber pattern is formed by a normal processing method, i.e., through resist coating, exposure, development and etching on the reflective mask blank. In the case of a reflective mask obtained using the reflective mask blank illustrated in FIG. 1, the absorber pattern is formed in the single-layer absorbent layer.

EXAMPLES

Ex. 1, Ex. 3 and Ex. 4 are Working Examples, and Ex. 2 is Comparative Example.

Ex. 1

A $SiO_2$—$TiO_2$-based glass substrate (outer dimension: about 152 mm square, thickness: about 6.3 mm) was used as the substrate for deposition. Here, the coefficient of thermal expansion of the glass substrate is $0.02 \times 10^{-7}$/° C. or less. The glass substrate is processed by polishing to have a smooth surface with a surface roughness of 0.15 nm or less in terms of root-mean-square roughness Rq and a flatness of 100 nm or less. A Cr layer having a thickness of about 100 nm was deposited on the backside of the substrate by use of a magnetron sputtering method to form a backside electroconductive layer for electrostatic chucking. The sheet resistance value of the Cr layer was about 100 Ω/sq.

After depositing the electroconductive layer on the backside of the substrate, a Si layer and a Mo layer were alternately deposited on the substrate surface by using a ion beam sputtering method, and this was repeated for 40 cycles. The film thickness of the Si film was about 4.0 nm, and the film thickness of the Mo film was about 3.0 nm. In this way, a reflective layer (multilayer reflective film) having a total film thickness of about 280 nm ((Si film: 4.0 nm+Mo film: 3.0 nm)×40) was formed. Thereafter, a Ru layer (film thickness: about 2.5 nm) was deposited on the reflective layer by ion beam sputtering method to thereby form a protective layer. At his time, the reflectance for a wavelength of 13.53 nm was 64%.

A TaNb film was deposited as the absorbent layer on the protective layer. TaNb (Ta:Nb=60:40) was used for the sputtering target, and Ar was used for the sputtering gas. An absorbent layer having an in-film plane thickness distribution was obtained by stopping the rotation of the stage during sputtering of the absorbent layer. In this way, the reflective mask blank illustrated in FIG. 1 was manufactured. The film thickness of the absorbent layer was measured by an X-ray reflectivity method (XRR) using an X-ray diffractometer (SmartLab HTP, manufactured by Rigaku Corp.).

Figure 10A:
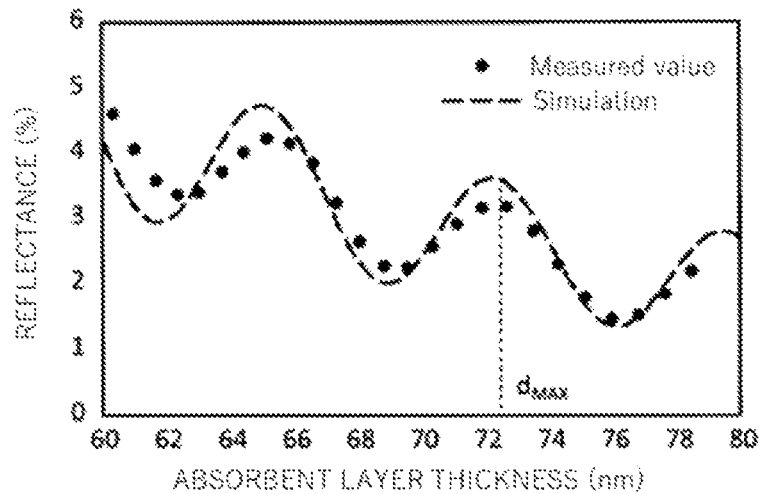
FIG. 10A is a diagram illustrating the relationship between the absorbent layer film thickness and the reflectance.

The relationship between the thickness and reflectance of the absorbent layer of the reflective mask blank was measured. The measurement of reflectance was performed using an EUV reflectometer (MBR, manufactured by AIXUV GmbH) for mask blanks. The wavelength of EUV light was set to 13.53 nm. FIG. 10A illustrates the relationship between the thickness and reflectance of the absorbent layer. The absorbent layer has a peak reflectance of 3.2% at a film thickness around 72 nm. This reflectance satisfies the requirements as a phase shift mask, i.e., 2.5% or more and 10% or less.

In FIG. 10A, simulation results are illustrated together with the measured values. In the simulation, the refractive index n for a wavelength of 13.53 nm was set to 0.945, and the absorption coefficient k for the same wavelength was set to 0.0236. It is understood that a good coincidence between the measured values and the simulation results is achieved.

Figure 10B:
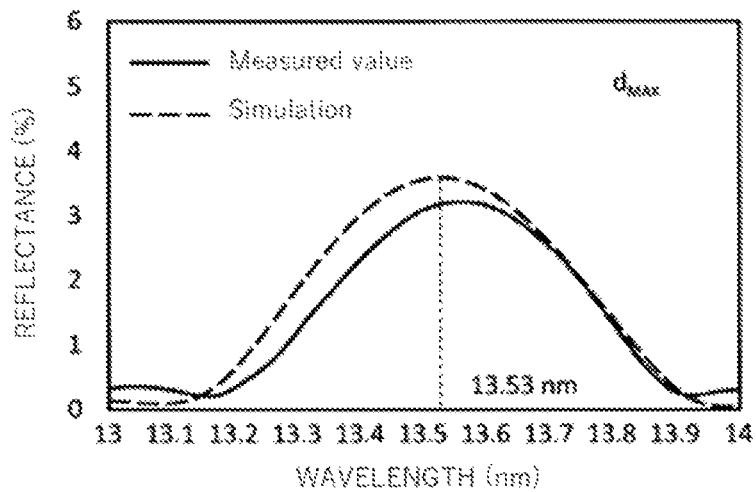
FIG. 10B is a diagram illustrating a reflected light spectrum when the film thickness of the absorbent layer is $d_{MAX}$.
Figure 10C:
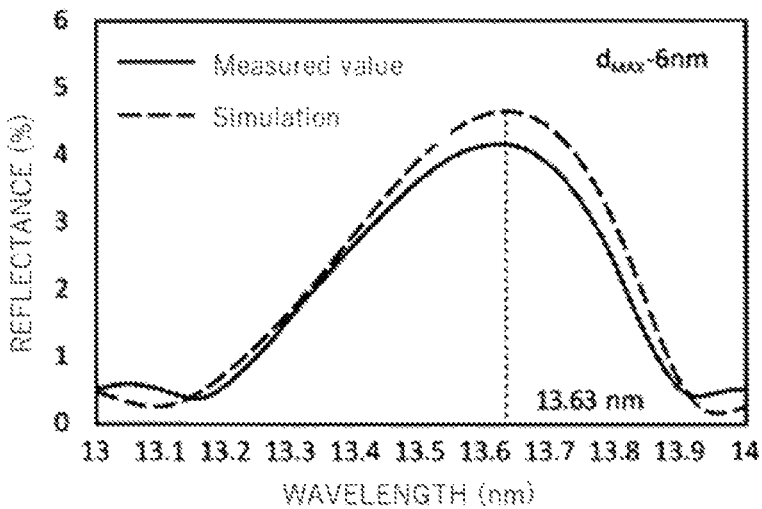
FIG. 10C is a diagram illustrating a reflected light spectrum when the film thickness of the absorbent layer is $d_{MAX}$–6 nm.

Under the above-described conditions, $d_{MAX}$ is determined to be 72.3 nm according to formula (4). FIG. 10B illustrates a reflected light spectrum when the film thickness is $d_{MAX}$, and FIG. 10C illustrates a reflected light spectrum when the film thickness is $d_{MAX}$–6 nm. It is understood that a good coincidence between the measured values and the simulation results is achieved. The reflected light spectrum can be used for the film thickness control of the phase shift mask.

Ex. 2

As the absorbent layer, a TaN film was used in place of the TaNb film. Providing that the refractive index n for a wavelength of 13.53 nm is 0.947 and the absorption coefficient k for the same wavelength is 0.031, $d_{MAX}$ was determined to be 72.0 nm according to formula (4). The reflectance at this time is determined to be 1.2% by the simulation and does not satisfy the requirements as a phase shift mask, i.e., 2.5% or more and 10% or less.

Figure 11A:
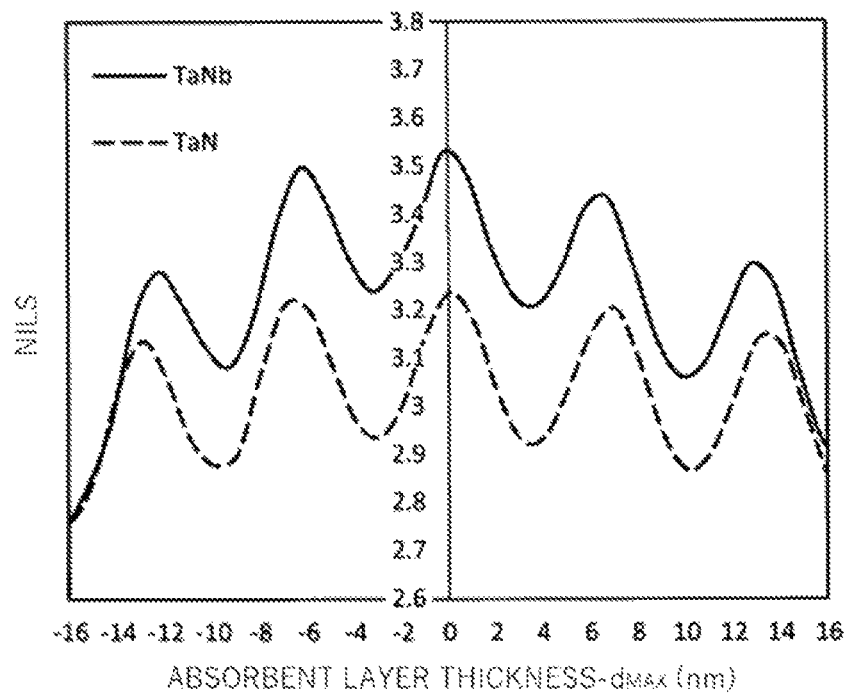
FIG. 11A is a diagram illustrating the relationship between the absorbent layer film thickness-$d_{MAX}$ and NILS with respect to Ex. 1 and Ex. 2.
Figure 11B:
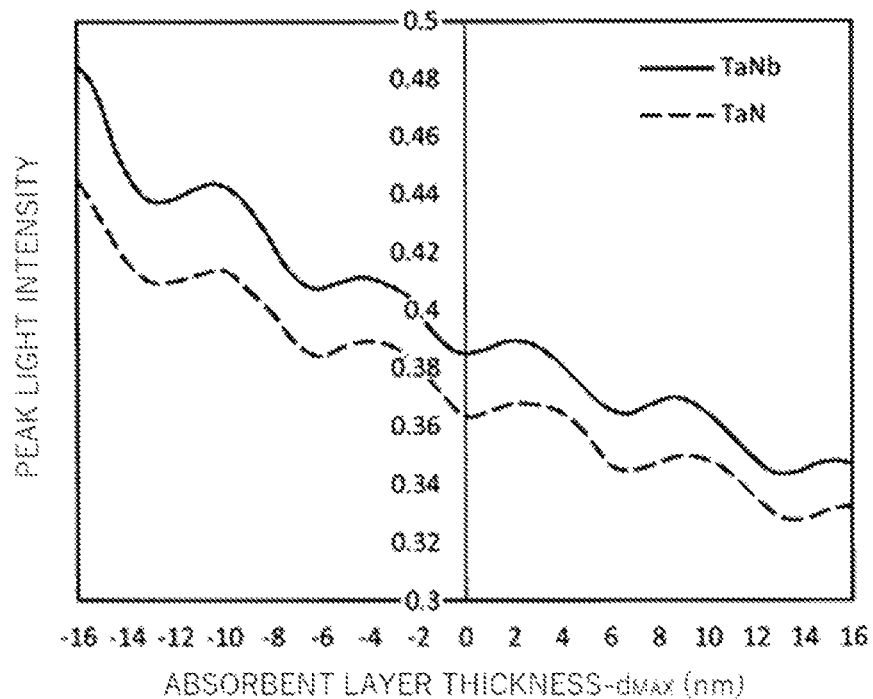
FIG. 11B is a diagram illustrating the relationship between the absorbent layer film thickness-$d_{MAX}$ and the peak light intensity with respect to Ex. 1 and Ex. 2.

FIG. 11A and FIG. 11B illustrate, with respect to Exs. 1 and 2, the simulation results when a 22-nm isolated hole pattern on a wafer was exposed under the exposure conditions of a numerical aperture NA of projection optical system of 0.33 and a σ value of 0.5. FIG. 11A illustrates the results of a simulation for determining the film thickness dependency of NILS, and FIG. 11B illustrates the results of a simulation for determining the film thickness dependency of peak light intensity of an optical image. In FIG. 11A and FIG. 11B, the abscissa axes display a difference between the film thickness of the absorbent layer and $d_{MAX}$ determined according to formula (4). As illustrated in FIG. 11A, it is understood that compared with Ex. 1 where the absorbent layer is TaNb film, in Ex. 2 where the absorbent layer is TaN film, NILS becomes much smaller and the phase shift effect is small. As illustrated in FIG. 11B, it is understood that compared with Ex. 1 where the absorbent layer is TaNb film, in Ex. 2 where the absorbent layer is TaN film, the peak light intensity during exposure is low.

Ex. 3

Figure 12A:
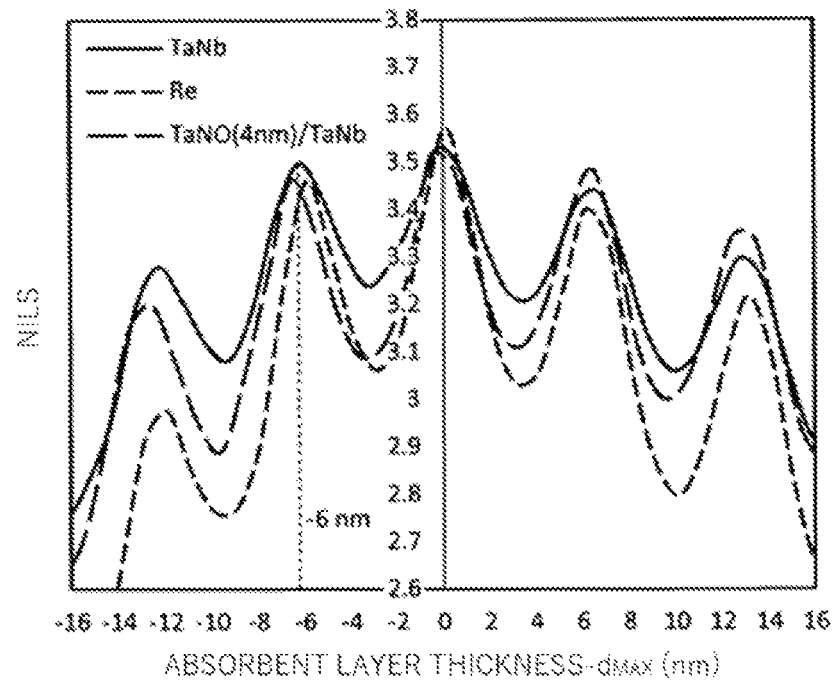
FIG. 12A is a diagram illustrating the relationship between the absorbent layer film thickness-dMAx and NILS with respect to Ex. 1, Ex. 3 and Ex. 4.
Figure 12B:
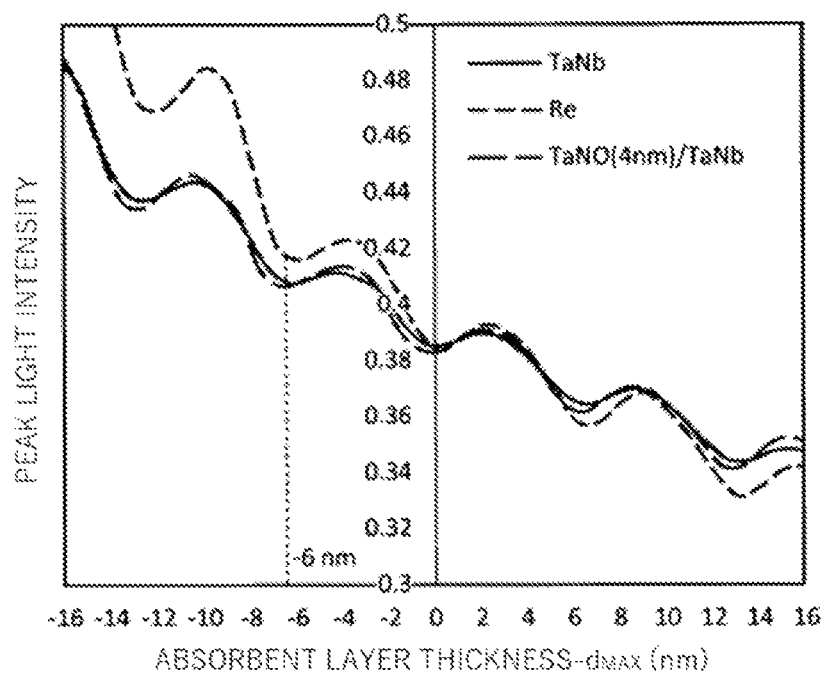
FIG. 12B is a diagram illustrating the relationship between the absorbent layer film thickness-$d_{MAX}$ and the peak light intensity with respect to Ex. 1, Ex. 3 and Ex. 4.

As the absorbent layer, a Re film was used in place of the TaNb film. Providing that the refractive index n for a wavelength of 13.53 nm is 0.933 and the absorption coefficient k for the same wavelength is 0.0405, $d_{MAX}$ is determined to be 44.8 nm according to formula (4), and the layer becomes much thinner than in Ex. 1 using TaNb film. This occurs because the n value is small. The reflectance here is determined to be 3.7% by the simulation and satisfies the requirements as a phase shift mask, i.e., 2.5% or more and 10% or less. FIG. 12A and FIG. 12B illustrate the simulation results when a 22-nm isolated hole pattern on a wafer was exposed under the exposure conditions of a numerical aperture NA of projection optical system of 0.33 and a σ value of 0.5. FIG. 12A illustrates the results of a simulation for determining the film thickness dependency of NILS, and FIG. 12B illustrates the results of a simulation for determining the film thickness dependency of peak light intensity of an optical image. In FIG. 12A and FIG. 12B, the abscissa axes display a difference between the film thickness of the absorbent layer and $d_{MAX}$ determined according to formula (4). As illustrated in FIG. 12A, NILS of Ex. 3 using Re film as the absorbent layer has a peak at an absorbent layer film thickness around $d_{MAX}$ and $d_{MAX}$–6 nm in the same way as Ex. 1 using TaNb film as the absorbent layer.

As seen from FIG. 12B, the light intensity of an optical image increases as the film thickness is thinner. On the other hand, NILS is maximized when the film thickness of the absorbent layer is $d_{MAX}$, and has a peak also at $d_{MAX}$–6 nm. The light intensity at a film thickness $d_{MAX}$–6 nm is higher by 6% than the light intensity at a film thickness $d_{MAX}$. Considering the balance between NILS and light intensity, the optimum value of the film thickness of the absorbent layer is either $d_{MAX}$ or $d_{MAX}$–6 nm.

Ex. 4

As the absorbent layer, a two-layer film (TaNO (4 nm)/TaNb film) consisting of a TaNb film as the lower absorbent layer and a TaNO film (film thickness: 4 nm) as the upper absorbent layer was used in place of the TaNb film. Providing that the refractive index $n_1$ for a wavelength of 13.53 nm of TaNb as the lower absorbent layer is 0.945, the refractive index $n_2$ for a wavelength of 13.53 nm of TaON as the upper absorbent layer is 0.968, and the absorption coefficient $k_2$ for the same wavelength is 0.0512, $d_{bi\ MAX}$ is determined to be 71.6 nm according to formula (6). The reflectance here is determined to be 3.5% by the simulation, and a sufficient effect as a phase shift mask can be expected. The TaNO film is located at the outermost surface and therefore, the film is strong against cleaning compared with the TaNb single film, and the stability over time is improved. FIG. 12A and FIG. 12B illustrate the simulation results when a 22-nm isolated hole pattern was exposed on a wafer under the exposure conditions of a numerical aperture NA of projection optical system of 0.33 and a σ value of 0.5. As illustrated in FIG. 12A, NILS of Ex. 4 using a two-layer film consisting of a TaNb film as the lower absorbent layer and a TaNO film (film thickness: 4 nm) as the upper absorbent layer has a peak at an absorbent layer film thickness around $d_{bi\ MAX}$ and $d_{bi\ MAX}$–6 nm in the same way as Ex. 1 using TaNb film as the absorbent layer.

As seen from FIG. 12B, the light intensity of an optical image increases as the film thickness is thinner. On the other hand, NILS is maximized when the film thickness of the absorbent layer is $d_{bi\ MAX}$, and has a peak also at $d_{bi\ MAX}$–6 nm. The light intensity at a film thickness $d_{bi\ MAX}$–6 nm is higher by 6% than the light intensity at a film thickness $d_{bi\ MAX}$. Considering the balance between NILS and light intensity, the optimum value of the film thickness of the absorbent layer is either $d_{bi\ MAX}$ or $d_{bi\ MAX}$–6 nm.

Figure 13A:
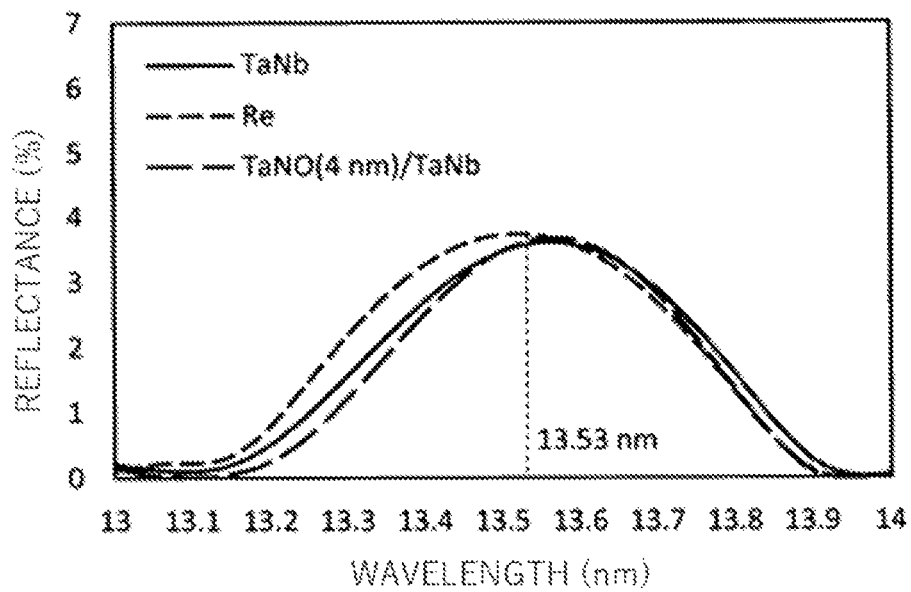
FIG. 13A is a diagram illustrating reflected light spectra when the film thickness of the absorbent layer is $d_{MAX}$ with respect to Ex. 1, Ex. 3 and Ex. 4.
Figure 13B:
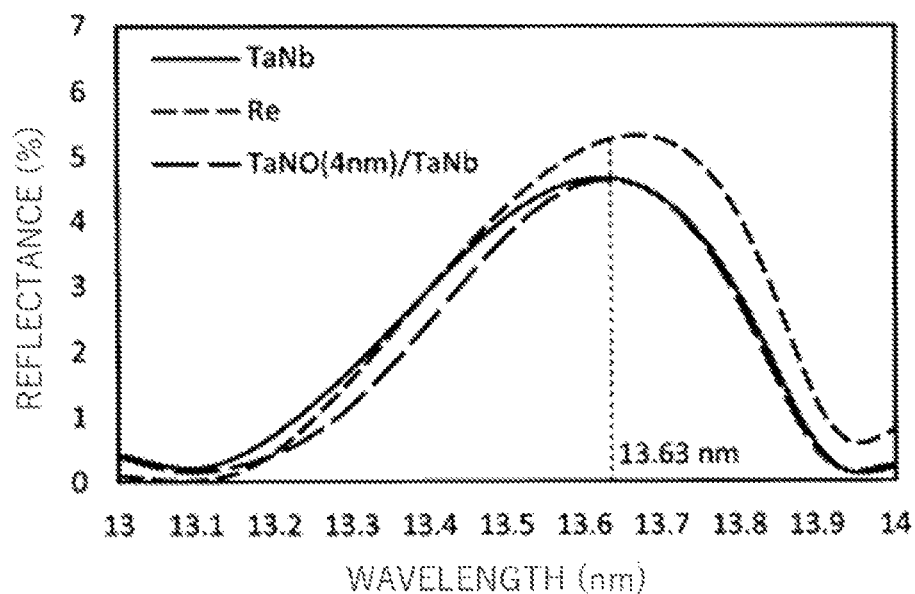
FIG. 13B is a diagram illustrating reflected light spectra when the film thickness of the absorbent layer is $d_{MAX}$–6 nm with respect to Ex. 1, Ex. 3 and Ex. 4.

FIG. 13A and FIG. 13B illustrate reflected light spectra of TaNb film, Re film and TaON (4 nm)/TaNb film described in Exs. 1, 3 and 4. In FIG. 13A where the film thickness is $d_{MAX}$ or $d_{bi\ MAX}$, the peak wavelength of the reflectance is located around 13.53 nm. In FIG. 13B where the film thickness is $d_{MAX}$–6 nm or $d_{bi\ MAX}$–6 nm, the peak wavelength of the reflectance is located around 13.63 nm. As seen from FIGS. 13(a) and (b), the peak wavelength of reflected light can be used as a reference for the film thickness control of the absorbent layer, regardless of the film species.

As described in the foregoing pages, the present invention provides the following reflected mask blank and reflected mask.

(1) A reflective mask blank including a substrate and, on or above the substrate in order, a reflective layer for reflecting EUV light, a protective layer for protecting the reflective layer, and an absorbent layer for absorbing EUV light, wherein the absorbent layer has a reflectance for a wavelength of 13.53 nm of from 2.5% to 10%, and a film thickness d of the absorbent layer satisfies a relationship of:

[Math. 9]

$$d_{MAX} - (i \times 6 + 1)\,\text{nm} \leq d \leq d_{MAX} - (i \times 6 - 1)\,\text{nm}$$

wherein the integer i is 0 or 1 and $d_{MAX}$ is is represented by:

[Math. 10]

$$d_{MAX}(\text{nm}) = \frac{13.53}{2n\cos 6°}\left\{INT\left(\frac{0.58}{1-n}\right) + \frac{1}{2\pi}\left(\tan^{-1}\left(\frac{-k}{1-n}\right) + 0.64\right)\right\}$$

wherein n is a refractive index of the absorbent layer, k is an absorption coefficient of the absorbent layer, and INT(x) is a function of returning an integer value obtained by truncating a decimal part.

(2) A reflective mask blank including a substrate and, on or above the substrate in order, a reflective layer for reflecting EUV light, a protective layer for protecting the reflective layer, and an absorbent layer for absorbing EUV light, wherein the absorbent layer has a reflectance for a wavelength of 13.53 nm of from 2._5% to 10%, the absorbent layer consists of two layers of a lower absorption layer and an upper absorption layer, and a film thickness $d_{bi}$ of the absorbent layer consisting of the two layers satisfies a relationship of:

[Math. 11]

$$d_{biMAX} - (i \times 6 + 1)\,\text{nm} \leq d_{bi} \leq d_{biMAX} - (i \times 6 - 1)\,\text{nm}$$

wherein the integer i is 0 or 1 and $d_{bi\,MAX}$ is represented by:

[Math. 12]

$$d_{biMAX}(\text{nm}) = \frac{13.53}{2n\cos 6°}\left\{INT\left(\frac{0.58}{1-n_1}\right) + \frac{1}{2\pi}\left(\tan^{-1}\left(\frac{-k_2}{1-n_2}\right) + 0.64\right)\right\}$$

wherein $n_1$ is a refractive index of the lower absorbent layer, $n_2$ is a refractive index of the upper absorbent layer, $k_2$ is an absorption coefficient of the upper absorbent layer, and INT(x) is a function of returning an integer value obtained by truncating a decimal part.

(3) The reflective mask blank according to (1) or (2) above, wherein a phase difference of reflected light for a wavelength of 13.53 nm of the absorbent layer relative to a reflected light for a wavelength of 13.53 nm of the reflective layer is from 190° to 220°.

(4) The reflected mask blank according to any one of (1) to (3) above, wherein the absorbent layer contains one or more elements selected from the group consisting of Ta, Nb, Mo, Ti, Zr, Re, Ru, Au, Pt, Pd, Rh, B, N and O.

(5) The reflected mask blank according to any one of (1) to (4) above, wherein denoting as $\lambda_{MAX}$ a peak wavelength in a reflected light spectrum of the absorbent layer, the peak wavelength satisfies:

[Math. 13]

$$\left(13.53 + \frac{i}{10} - 0.1\right)\,\text{nm} \leq \lambda_{MAX} \leq \left(13.53 + \frac{i}{10} + 0.1\right)\,\text{nm}$$

in correspondence to the integer i.

(6) The reflective mask blank according to any one of (1) to (5) above, including a hard mask layer is provided on the absorbent layer.

(7) The reflective mask blank according to (6) above, wherein the hard mask layer contains at least one element of Cr and Si.

(8) The reflective mask blank according to any one of (1) to (7) above, including a backside electroconductive layer on a backside of the substrate.

(9) The reflective mask blank according to (8) above, wherein a material of the backside electroconductive layer is Cr, Ta, or an alloy of Cr or Ta.

(10) A reflective mask obtained by forming a pattern in the absorbent layer of the reflective mask blank according to any one of (1) to (9) above.

Although embodiments have been described hereinabove, the embodiments are presented as mere examples, and the present invention is not limited by these embodiments.

The embodiments can be implemented in various other modes, and various combinations, omissions, replacements, modifications, etc. can made therein without departing from the gist of the present invention. These embodiments and modifications are encompassed by the scope and gist of the present invention and encompassed by the invention described in claims and by ranges equivalent to.

This application is based on Japanese Patent Application 2019-195856 filed on Oct. 29, 2019, the contents of which are incorporated herein by way of reference.

REFERENCE SIGNS LIST

10 Substrate
20 Reflective layer
30 Protective layer
40 Absorbent layer
41 Lower absorbent layer
42 Upper absorbent layer
60 Absorber pattern

The invention claimed is:

1. A reflective mask blank comprising a substrate and, on or above the substrate in order, a reflective layer for reflecting EUV light, a protective layer for protecting the reflective layer, and an absorbent layer for absorbing EUV light, wherein the absorbent layer has a reflectance for a wavelength of 13.53 nm of from 2.5% to 10%, and a film thickness d of the absorbent layer satisfies a relationship of

[Math. 1]

$$d_{MAX} - (i \times 6 + 1) \, \text{nm} \leq d \leq d_{MAX} - (i \times 6 - 1) \, \text{nm}$$

wherein the integer i is 0 or 1, and $d_{MAX}$ is represented by:

$$d_{MAX}(\text{nm}) = \frac{13.53}{2n \cos 6°} \left\{ INT\left(\frac{0.58}{1-n}\right) + \frac{1}{2\pi}\left(\tan^{-1}\left(\frac{-k}{1-n}\right) + 0.64\right) \right\}$$

wherein n is a refractive index of the absorbent layer, k is an absorption coefficient of the absorbent layer, and INT(x) is a function of returning an integer value obtained by truncating a decimal part.

2. The reflective mask blank according to claim 1, wherein a phase difference of a reflected light for a wavelength of 13.53 nm of the absorbent layer relative to a reflected light for a wavelength of 13.53 nm of the reflective layer is from 190° to 220°.

3. The reflected mask blank according to claim 1, wherein the absorbent layer comprises one or more elements selected from the group consisting of Ta, Nb, Mo, Ti, Zr, Re, Ru, Au, Pt, Pd, Rh, B, N and O.

4. The reflected mask blank according to claim 1, wherein denoting as $\lambda_{MAX}$ a peak wavelength in a reflected light spectrum of the absorbent layer, the peak wavelength satisfies:

$$\left(13.53 + \frac{i}{10} - 0.1\right) \text{nm} \leq \lambda_{MAX} \leq \left(13.53 + \frac{i}{10} + 0.1\right) \text{nm}$$

in correspondence to the integer i.

5. The reflective mask blank according to claim 1, comprising a hard mask layer on the absorbent layer.

6. The reflective mask blank according to claim 5, wherein the hard mask layer comprises at least one element of Cr and Si.

7. The reflective mask blank according to claim 1, comprising a backside electroconductive layer on a backside of the substrate.

8. The reflective mask blank according to claim 7, wherein a material of the backside electroconductive layer is Cr, Ta, or an alloy of Cr or Ta.

9. A reflective mask obtained by forming a pattern in the absorbent layer of the reflective mask blank according to claim 1.

* * * * *